United States Patent [19]

Kuroda

[11] Patent Number: 4,577,158
[45] Date of Patent: Mar. 18, 1986

[54] DEMODULATOR WITH DROP-OUT COMPENSATION AND RECIPROCAL AMPLIFIER

[75] Inventor: Kazuo Kuroda, Saitama, Japan

[73] Assignee: Pioneer Electronic Corporation, Tokyo, Japan

[21] Appl. No.: 561,868

[22] Filed: Dec. 16, 1983

[30] Foreign Application Priority Data

Dec. 16, 1982 [JP] Japan .................................. 57-220848

[51] Int. Cl.$^4$ ........................ H03K 9/06; H03D 3/00
[52] U.S. Cl. .................................... 329/104; 329/107; 329/110; 329/126; 329/128; 375/82; 455/214
[58] Field of Search ................. 329/50, 110, 126, 128, 329/104, 107; 375/82; 455/214

[56] References Cited

U.S. PATENT DOCUMENTS 3,075,149  1/1963  Marshall ............................... 329/107
3,638,128  1/1972  Downs .................................. 329/126
4,485,347  11/1984  Hirasawa et al. ..................... 329/50

FOREIGN PATENT DOCUMENTS 0034669  3/1979  Japan ..................................... 329/50
0671029  6/1979  U.S.S.R. ................................ 329/110

Primary Examiner—Eugene R. LaRoche
Assistant Examiner—D. C. Mis
Attorney, Agent, or Firm—Sughrue, Mion, Zinn, Macpeak & Seas

[57] ABSTRACT

An FM signal demodulating circuit which provides accurate drop-out compensation without producing an unnatural sounding output. The period of the receive FM signal is periodically detected for each cycle thereof to produce a signal having a level corresponding to the period of the FM signal. The signal so derived is held for each period of the FM signal, including periods during which drop-out occurs. The reciprocal of the level of the held signal forms the demodulated output signal.

6 Claims, 13 Drawing Figures

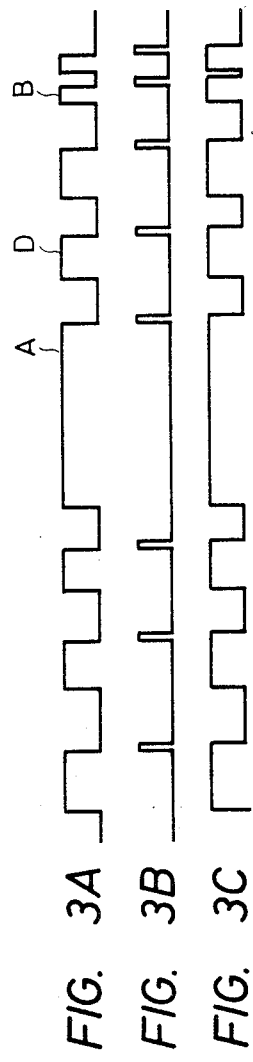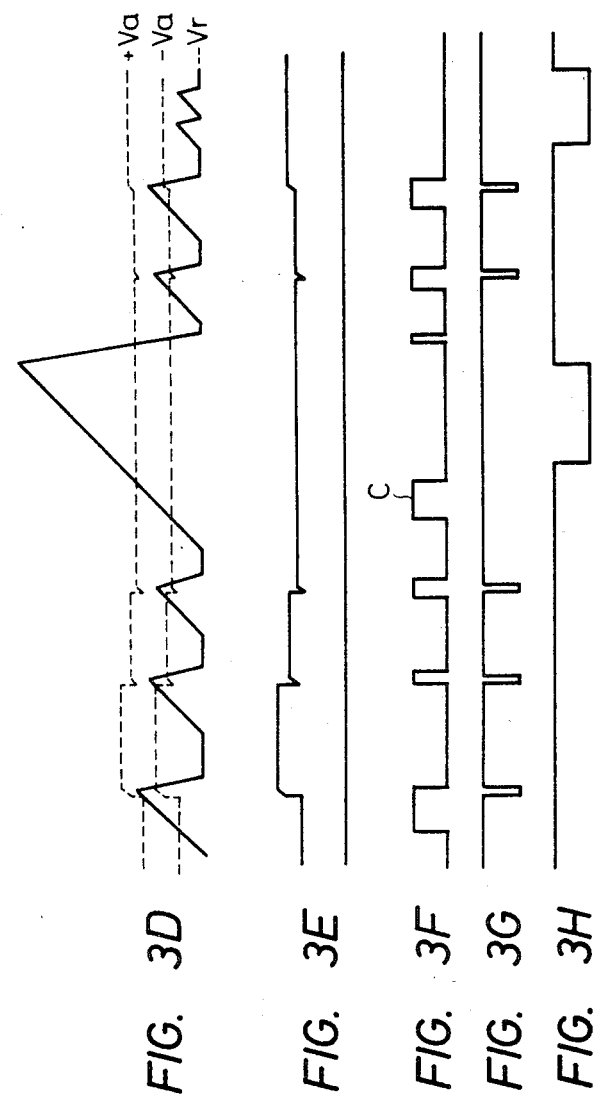

DEMODULATOR WITH DROP-OUT COMPENSATION AND RECIPROCAL AMPLIFIER

BACKGROUND OF THE INVENTION

The present invention relates to an FM signal demodulating circuit.

A prior art pulse count demodulating circuit, which is an example of an FM signal demodulating circuit, is shown in FIG. 1. In this circuit, an FM signal is fed to a limiter 1, which has its output terminal connected to the input of a monostable multivibrator 2. The multivibrator 2 thus generates pulses of a predetermined width upon the occurrence of falling edges of the output pulses from the limiter 1. A drop-out compensator 4 is connected through a low-pass filter (LPF) 3 to the output terminal of the monostable multivibrator 2. The output signal of the drop-out compensator 4 is representative of a demodulated audio signal of the FM signal.

In the FM signal demodulating circuit thus arranged, the FM signal fed to the limiter 1 is subjected therein to waveform shaping. Specifically, voltages above a first predetermined value and below a second predetermined value lower than the first predetermined value are clamped to thereby provide square pulses. The monostable multivibrator 2 generates reference pulses of a predetermined width in response to the falling edges of the square pulses produced by the limiter 1, and the reference pulses are integrated by the LPF 3 and fed to the drop-out compensator 4. The drop-out compensator 4 outputs the integrated signal of the LPF 3 while holding the same. In this manner, when drop-out occurs, the integrated signal immediately before the occurrence of the drop-out is outputted as the demodulated audio signal from the drop-out compensator 4.

In such a prior art FM singal demodulating circuit, since the reference pulses are outputted upon being integrated by the LPF 3, even in the case where the drop-out period of the FM signal is short, a time longer than the drop-out period is required before the integrated output signal of the LPF 3 returns to a proper level. As a result, the drop-out compensator 4 must provide its output over a period of time longer than that actually needed for drop-out compensation. If, however, the period for continuously outputting the integrated signal is prolonged, there arises a problem that the reproduced demodulated audio signal has an unnatural sound. Moreover, if the time constant of the LPF 3 is made small, high-frequency noise is allowed to pass therethrough, thereby inviting improper sampling such that an accurately demodulated signal cannot be obtained.

SUMMARY OF THE INVENTION

It is, therefore, an object of the present invention to provide an FM signal demodulating circuit which provides accurate drop-out compensation without producing an unnatural sounding output.

The FM signal demodulating circuit according to the present invention is characterized in that the period of an FM signal is detected for each cycle thereof to produce a periodic signal having a level corresponding to the period of the FM signal, while holding the same until a subsequent detection, and that the periodic signal being held and outputted is continuously held and outputted during the period for which drop-out occurs, and that the reciprocal of the level of the periodic signal is used as a demodulated audio signal.

BRIEF DESCRIPTION OF THE DRAWINGS

Other objects, features and advantages of the present invention will be described in the following with reference to the accompanying drawings, in which:

FIGS. 3A to 3H are waveform diagrams illustrating the operations of the respective blocks of the circuit of FIG. 2.

DESCRIPTION OF THE PREFERRED EMBODIMENT

A preferred embodiment of the present invention will now be described with reference to FIGS. 2 and 3A through 3H.

Figure 1:
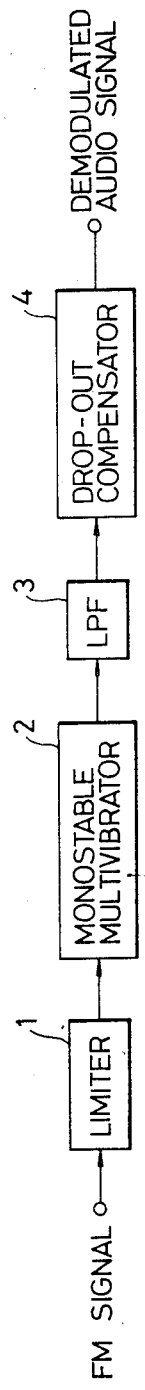
FIG. 1 is a block diagram showing a conventional example of an FM signal demodulating circuit.
Figure 2:
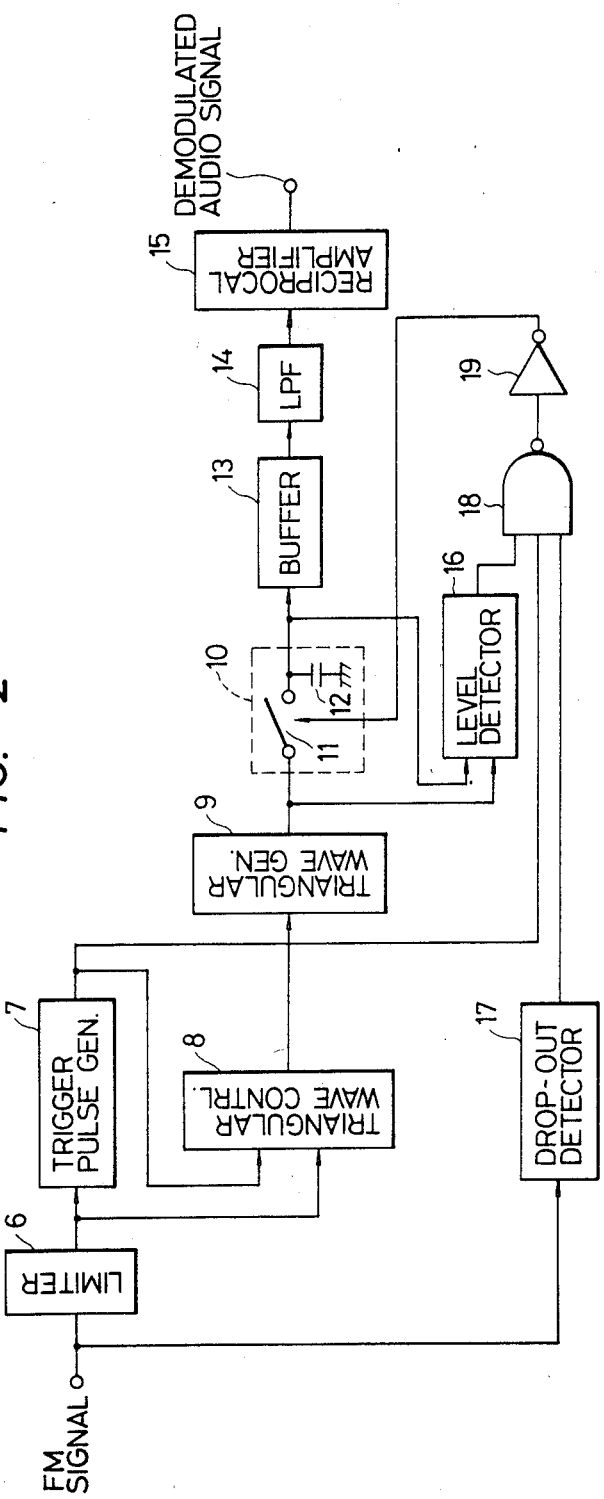
FIG. 2 is a block diagram showing a preferred embodiment of an FM demodulating circuit of the present invention.

In the FM signal demodulating circuit according to the embodiment of the present invention shown in FIG. 2, the FM signal is fed, as in the prior art arrangement shown in FIG. 1, to a limiter 6 which generates square pulses. The output terminal of the limiter 6 is connected to a trigger pulse generator 7 which generates trigger pulses of a predetermined width in response to the falling edges of the square pulses. The output terminal of the trigger pulse generator 7 is connected to a triangular waveform controller 8 to which the output of the limiter 6 is further connected. The triangular waveform controller 8 supplies a triangular waveform generator 9 with control pulses which are composed of the square pulses and the trigger pulses. The output terminal of the triangular waveform generator 9 is connected to a sample-and-hold circuit 10, which includes a switch circuit 11 having a movable contact and a capacitor 12 for holding and outputting the voltage when the switch 11 is turned on. The output terminal of the sample-and-hold circuit 10 is connected through a buffer amplifier 13 and an LPF (Low-Pass Filter) 14 to a reciprocal amplifier 15, the output voltage of which is used as the demodulated audio signal of the FM signal.

Further, a level detector 16 generates level-detected pulses having a high level when the output voltage of the triangular waveform generator 9, namely, the triangular waveform voltage, is within a voltage range of $\pm V_a$ with respect to the output voltage of the sample-and-hold circuit 10, that is, a holding voltage $V_h$. The FM signal is further fed to a drop-out detector 17 which generates drop-out detection pulses having a low level only when drop-out of the FM signal occurs. The respective output terminals of the trigger pulse generator 7, the level detector 16 and the drop-out detector 17 are connected through a NAND gate 18 and an inverter 19 to the movable contact of the switch 11 of the sample-and-hold circuit 10.

In the FM signal demodulating circuit thus constructed, when the FM signal is fed to the limiter 6, the FM signal is subjected to waveform shaping wherein the high and low level portions thereof are clamped to provide square pulses as illustrated in FIG. 3A. In response to the falling edges of detected pulses, the trigger pulse generator 7 generates trigger pulses as illustrated in FIG. 3B. The triangular waveform controller 8 supplies the triangular waveform generator 9 with such control pulses in response to the square pulses and the trigger pulses as illustrated in FIG. 3C.

The output voltage of the triangular waveform generator 9 rises at a predetermined rate from a reference level $V_r$ during the period for which the control pulses are supplied, and abruptly falls to the reference level $V_r$ upon the disappearance of the control pulses, as illustrated in FIG. 3D; thus, its waveform is triangular. Immediately after reception of the FM signal, the level detector 16 generates the level-detected pulses as the output voltage of the triangular waveform generator 9 rises so that the sampling pulses synchronized with the trigger pulses are fed from the inverter 19 to the switch 11, whereby the output voltage of the triangular waveform generator 9 when the sampling pulses are being supplied is held on the capacitor 12 and outputted as the hold voltage $V_h$ (as illustrated in FIG. 3E) of the sample-and-hold circuit 10. After that, the level detector 16 generates such level-detected pulses as illustrated in FIG. 3F only when the output voltage of the triangular waveform generator 9 is within the voltage range of the holding voltage $V_h \pm V_a$. When these level-detected pulses are present but not drop-out detection pulses, the sampling pulses, synchronized with the trigger pulses as illustrated in FIG. 3G, are fed to the switch 11 so that the output voltage of the triangular waveform generator 9, in the presence of the sampling pulses, is outputted as the held voltage $V_h$ of the sample-and-hold circuit 10, similarly to the aforementioned operation.

The holding voltage $V_h$ is integrated by the LPF 14 to provide a continuous voltage, which is fed to the reciprocal amplifier 15. Since the held voltage $V_h$ changes in proportion to the period of the FM signal, a voltage proportional to the frequency changes of the demodulated FM signal is generated by the reciprocal amplifier 15.

When drop-out occurs in the FM signal, the square pulses of the output of the limiter 6 fall, as indicated by A in FIG. 3A, so that their edges disappear. Moreover, when drop-out occurs, the levels of the square pulses may be lowered as the width of the square pulses become shorter than that of the previous square pulses, as indicated by B in FIG. 3A. At this time, the drop-out detector 17 generates the drop-out detection pulses at the low level, as illustrated in FIG. 3H. As a result, since the trigger pulses do not appear even if the level-detected pulses are present, as indicated by C in FIG. 3F, the sampling pulses do not appear, whereupon the sampling-and-hold circuit 10 continuously outputs the level of the previously held voltage $V_h$. In the case of the square pulses A, the output voltage of the triangular waveform generator 9 drops when the trigger pulses appear in response to the falling edges of the square pulses so that the control pulses disappear. Since the sampling pulses appear in response to a subsequent square pulse (as indicated by D in FIG. 3A), the output voltage of the triangular waveform generator 9 is newly subjected to sampling-and-holding.

In the FM signal demodulating circuit of the present invention, the reciprocal arithmetic device is not limited to a reciprocal amplifier, as in the aforementioned embodiment, but may be implemented with a VCO (Voltage-Controlled-Oscillator). On the other hand, in the case where the drop-out detector 17 is provided as an external circuit of a demodulating circuit in an FM signal processing device such as a tuner, the level detector 13 may be dispensed with if the drop-out detector 17 can detect all drop-out of the FM signal. Alternatively, drop-out may be sensed using only the respective output signals of the level detector 13 and the trigger pulse generator 7 without the use of the drop-out detector 17.

According to the FM signal demodulating circuit of the present invention, as described hereinbefore, a periodic signal having a level corresponding to the period of the FM signal is periodically sampled-and-held, and the reciprocal of the value of the periodic signal is outputted as the demodulated signal of the FM signal in such a manner that the periodic signal being held is continuously held when drop-out of the FM signal occurs. As a result, compensation during the appearance of the drop-out can be effected in a shorter time than in the prior art approach, so that unnatural output sound is prevented.

Figure 4:
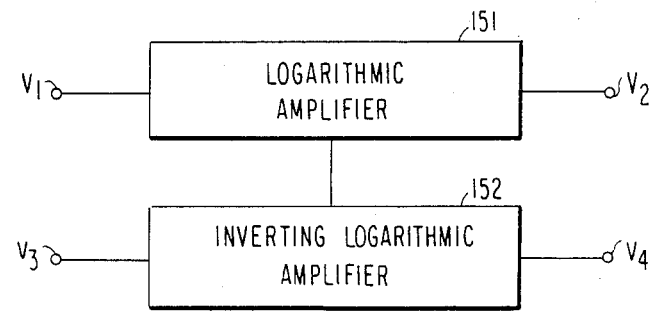
FIGS. 4, 5 and 6 are block diagrams of three different constructions of a reciprocal amplifier.
Figure 5:
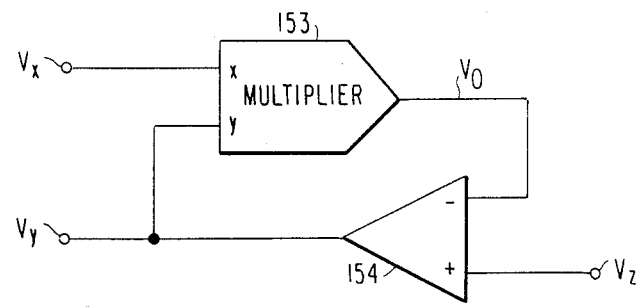
Figure 6:
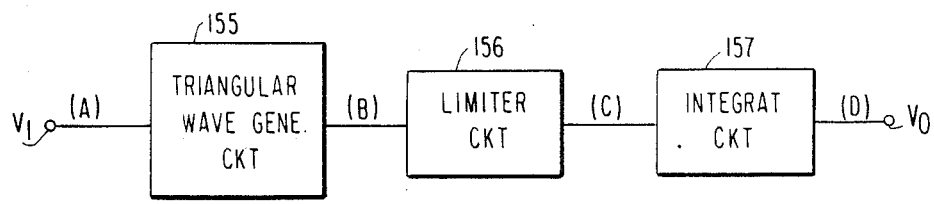

Moreover, in the FM signal demodulating circuit of the present invention, the reciprocal amplifier may be implemented, as shown in FIG. 4, with a logarithmic amplifier 151 and an inverting logarithmic amplifier 152, both of which are well known in art, or it may be implemented, as shown in FIG. 5, with an operational amplifier 154 connected with a multiplier 153 in its negative feedback loop. The reciprocal amplifier may, as shown in FIG. 6, include a circuit 155 for generating triangular waves with a constant slope but with an amplitude varied in accordance with the level of an input signal, a waveform shaping circuit 156 for outputting the triangular waves while limiting its amplitude to a predetermined level, and an integrator 157 for integrating the shaped output.

I claim:

1. An FM signal demodulating circuit comprising:
   drop-out detecting means for generating a drop-out signal when an input FM signal drops out;
   period detecting means for detecting the period of said FM signal in the absence of said drop-out signal to produce a periodic signal;
   voltage generating means for generating a voltage, a level of the voltage corresponding to the period of said FM signal;
   sample-and-hold means for sampling an output of said voltage generating means in response to said periodic signal and for holding the same;
   reciprocal arithmetic means for producing a signal representing the reciprocal of the level of signal held by said sample-and-hold means;
   and means responsive to said drop-out detecting means for causing said sample-and-hold means to stop sampling when said drop-out detection means detects a drop-out.

2. The FM signal demodulating circuit of claim 1 wherein said period detecting means comprises, a limiter receiving on an input thereof said FM signal, and a trigger pulse generator for producing trigger pulses of a predetermined width in response to a falling edge of an output signal from said limiter; and wherein said voltage generating means comprises, a triangular wave controller for producing a control signal rising at said rising edges of said output signal of said limiter and falling at a falling edge of an output of said trigger pulse generator, and a triangular wave generator for producing a triangular-waveform signal in response to said control signal, said triangular-waveform signal rising at a first predetermined rate at rising edges of said control signal and falling at a second predetermined rate at falling edges of said control signal; said sample-and-hold means having a sampling input coupled to an output of said triangular wave generator; said demodulating circuit further comprising, a level detector comprising a comparator having a first input coupled to an output of said sample-and-hold means and second input coupled to said output of said triangular wave generator; said means for causing comprising, AND gate means having first through third inputs coupled, respectively, to receive said drop-out signal from said drop-out detecting means, said output of said trigger pulse generator, and an output of said level detector, an output of said AND gate means being coupled to a sampling signal input of said sample-and-hold means; and wherein said reciprocal amplifier has an input coupled to said output of said sample-and-hold means, and produces a demodulated audio signal at an output of said reciprocal amplifier.

3. The FM signal demodulating circuit of claim 2, further comprising a buffer and a low-pass filter coupled between said output of said sample-and-hold means and said reciprocal amplifer.

4. The FM signal demodulating circuit of claim 2, wherein said reciprocal amplifier comprises a logarithmic amplifier and an inverting logarithmic amplifier.

5. The FM signal demodulating circuit of claim 2, wherein said reciprocal amplifier comprises an operational amplifier and a multiplier connected in a negative feedback path of said operational amplifier.

6. The FM signal demodulating circuit of claim 2, wherein said reciprocal amplifier comprises a circuit for generating triangular waves having a constant slope and an amplitude determined in accordance with a signal present at said output of said sample-and-hold means; a limiter circuit having an input coupled to an output of said triangular wave generating circuit; and an integrator for integrating an output signal present at an output of said limiter.

* * * * *